United States Patent
Sasahara et al.

(10) Patent No.: US 11,548,804 B2
(45) Date of Patent: Jan. 10, 2023

(54) METHOD AND APPARATUS FOR PROCESSING OXYGEN-CONTAINING WORKPIECE

(71) Applicant: TOKYO ELECTRON LIMITED, Tokyo (JP)

(72) Inventors: Reiko Sasahara, Nirasaki (JP); Yasuo Nakatani, Nirasaki (JP); Keiko Hada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 405 days.

(21) Appl. No.: 16/529,148

(22) Filed: Aug. 1, 2019

(65) Prior Publication Data

US 2020/0048134 A1 Feb. 13, 2020

(30) Foreign Application Priority Data

Aug. 8, 2018 (JP) .............................. JP2018149721

(51) Int. Cl.
| | | |
|---|---|---|
| *C03B 19/14* | (2006.01) | |
| *H01L 21/3115* | (2006.01) | |
| *H01L 21/02* | (2006.01) | |

(52) U.S. Cl.
CPC .... *C03B 19/1461* (2013.01); *H01L 21/02164* (2013.01); *H01L 21/02312* (2013.01); *H01L 21/3115* (2013.01); *C03B 2201/02* (2013.01)

(58) Field of Classification Search
CPC ............ C03B 19/1461; C03B 2201/02; H01L 21/02164; H01L 21/02312; H01L 21/3115
See application file for complete search history.

(56) References Cited

U.S. PATENT DOCUMENTS

| | | | | |
|---|---|---|---|---|
| 2002/0073922 | A1* | 6/2002 | Frankel | ............... C23C 16/4405 118/715 |
| 2007/0087579 | A1* | 4/2007 | Kitayama | ........... C23C 16/4405 438/794 |
| 2017/0260626 | A1* | 9/2017 | Nagato | ............. H01L 21/02164 |

FOREIGN PATENT DOCUMENTS

| | | |
|---|---|---|
| JP | 2009203142 A | 9/2009 |
| JP | 2016011252 A | 1/2016 |

OTHER PUBLICATIONS

- Mitani Yuichiro et al.,"Reexamination of Fluorine Incorporation in SiO2—Significant Improvement of Charge-to-Breakdown Distribution Tail"—International Reliability Physics Symposium proceedings, IEEE, 1999, pp. 93-98.

\* cited by examiner

*Primary Examiner* — Monica D Harrison
*Assistant Examiner* — Andre C Stevenson
(74) *Attorney, Agent, or Firm* — Nath, Goldberg & Meyer; Jerald L. Meyer; Tanya E. Harkins

(57) ABSTRACT

There is provided a method of processing an oxygen-containing workpiece. The method of processing an oxygen-containing workpiece includes controlling a fluorine concentration in the oxygen-containing workpiece based on at least one of a kind of a fluorine-containing processing gas, a processing temperature and a processing pressure used for processing the oxygen-containing workpiece.

6 Claims, 14 Drawing Sheets

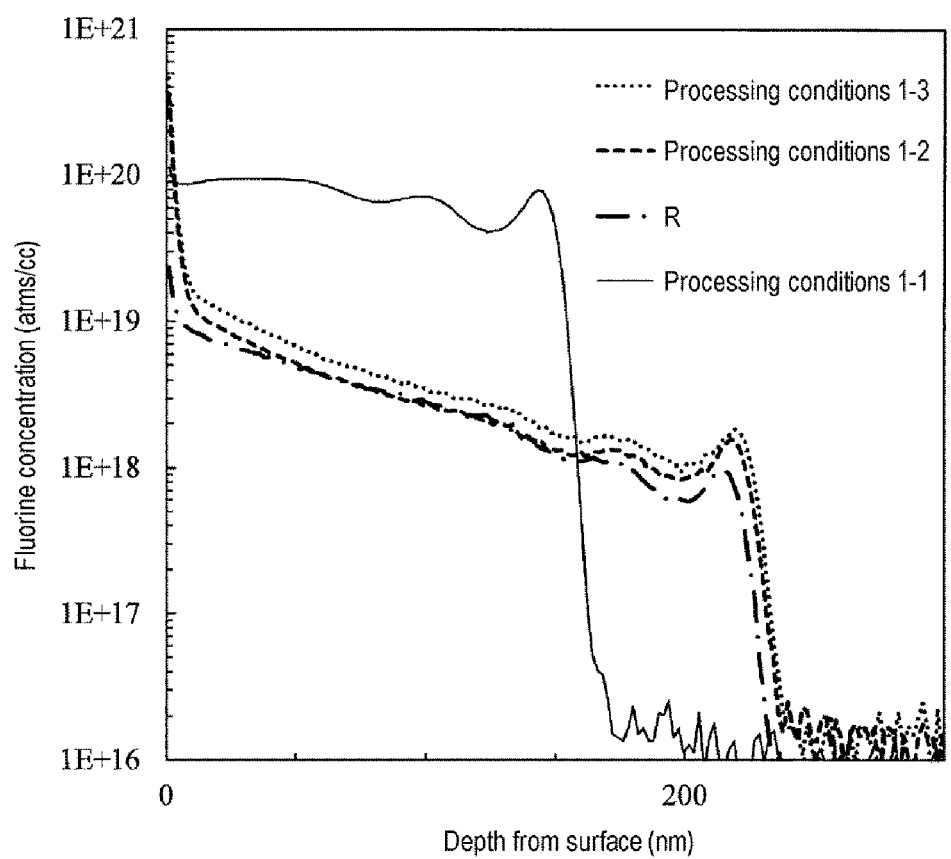

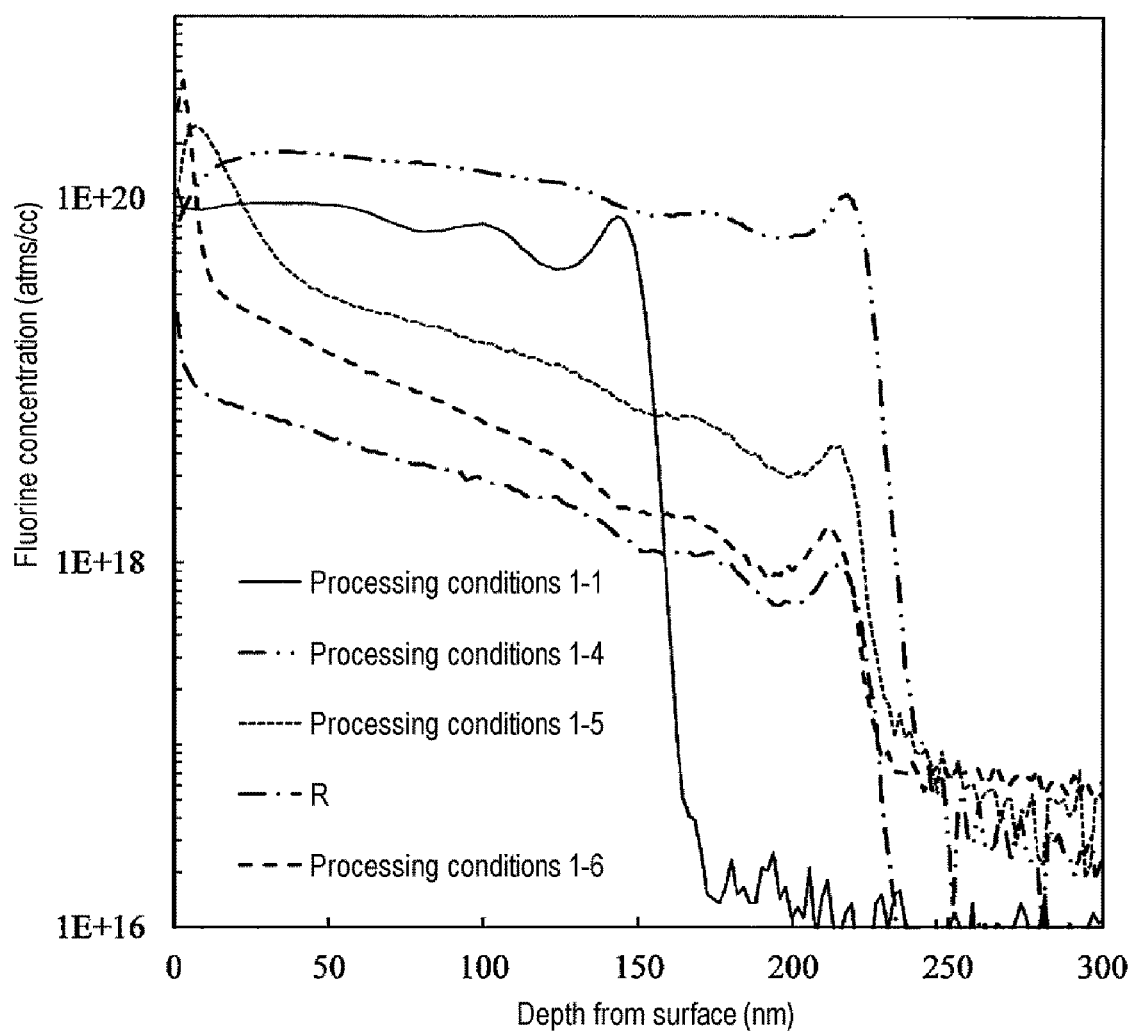

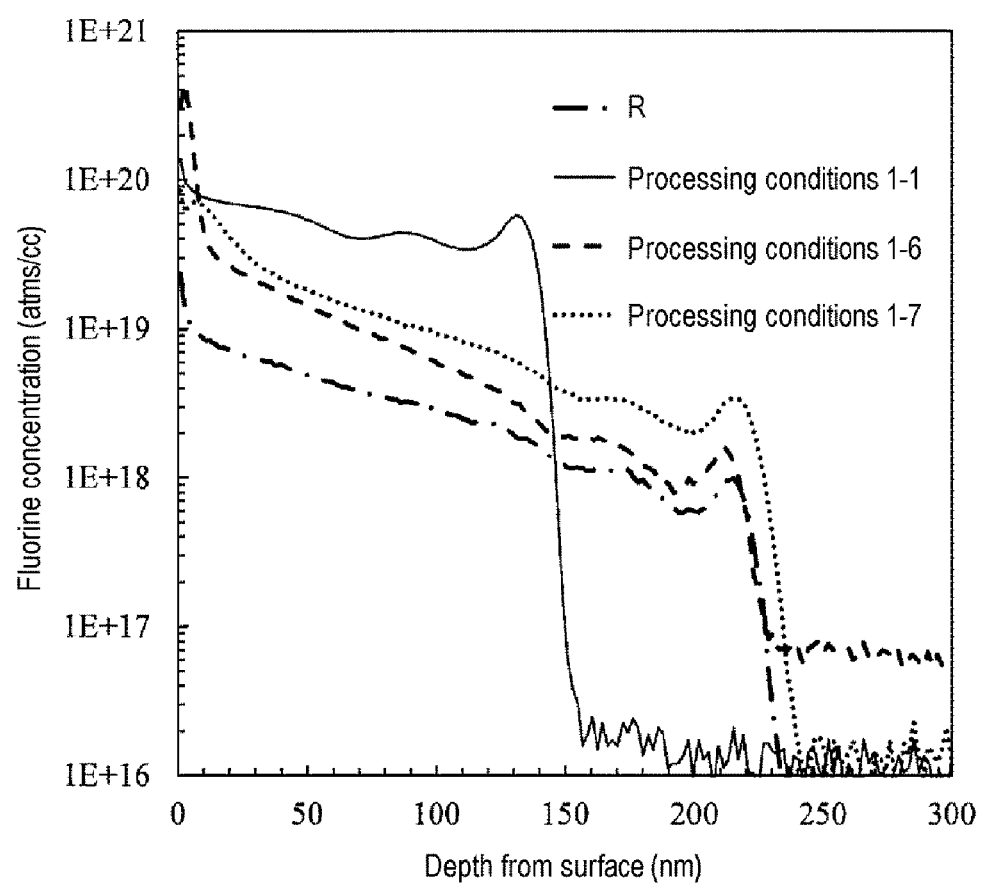

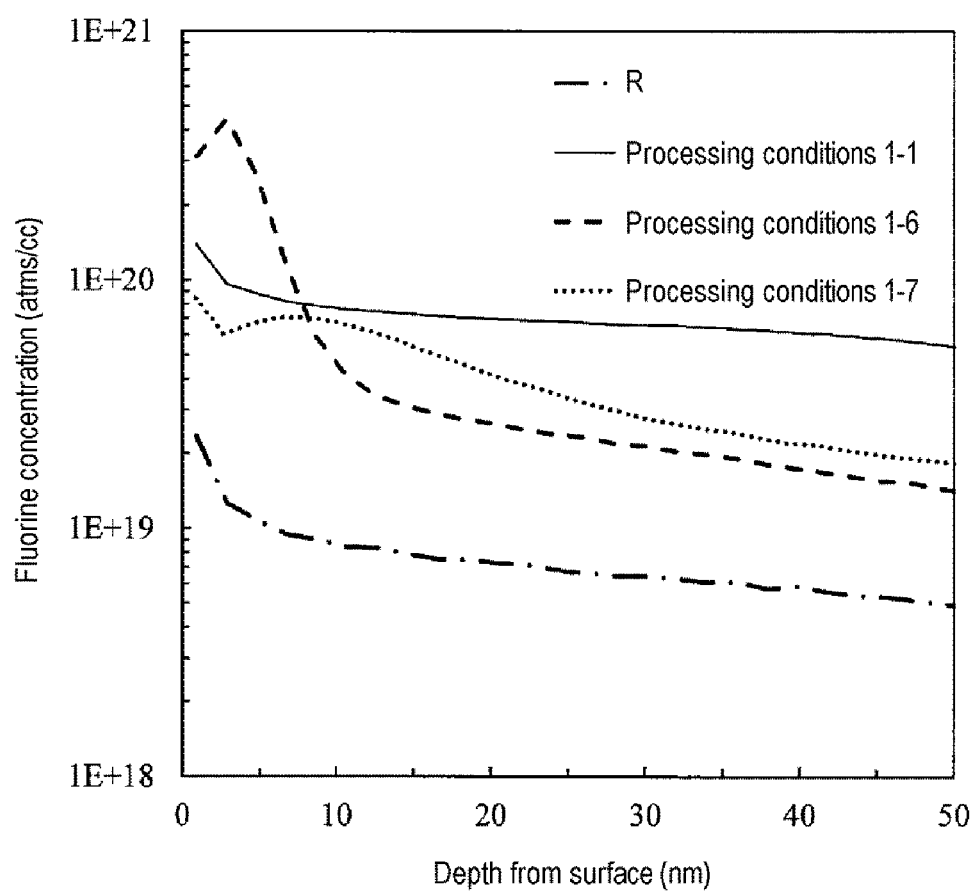

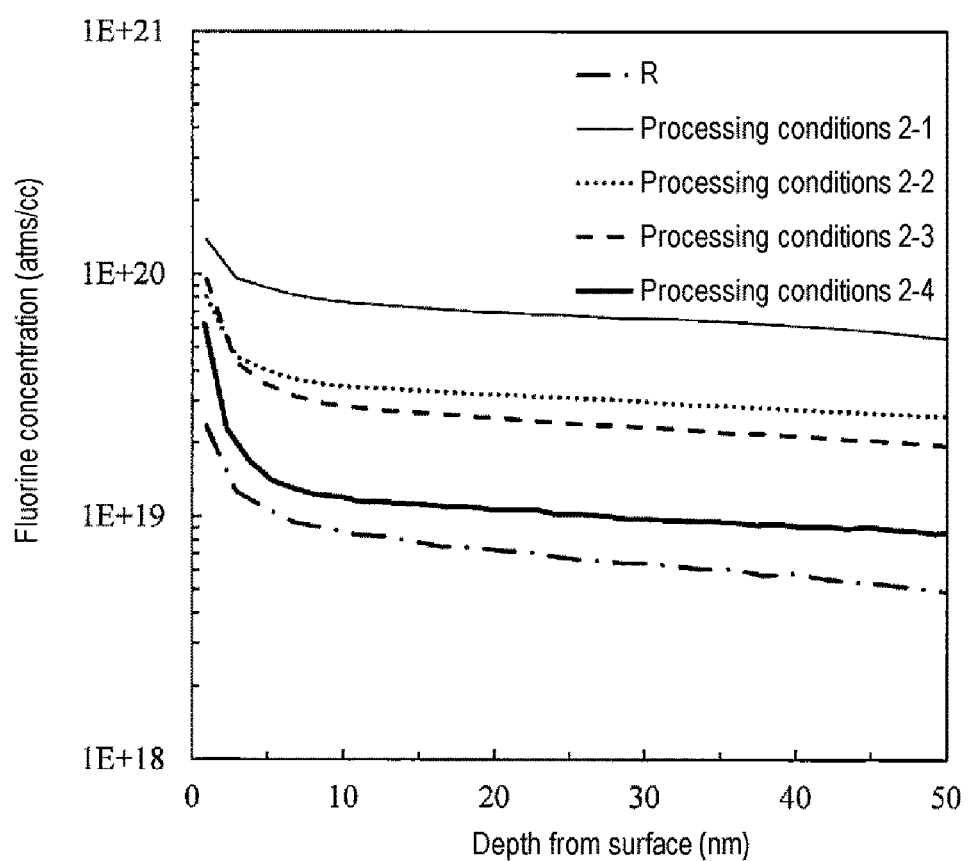

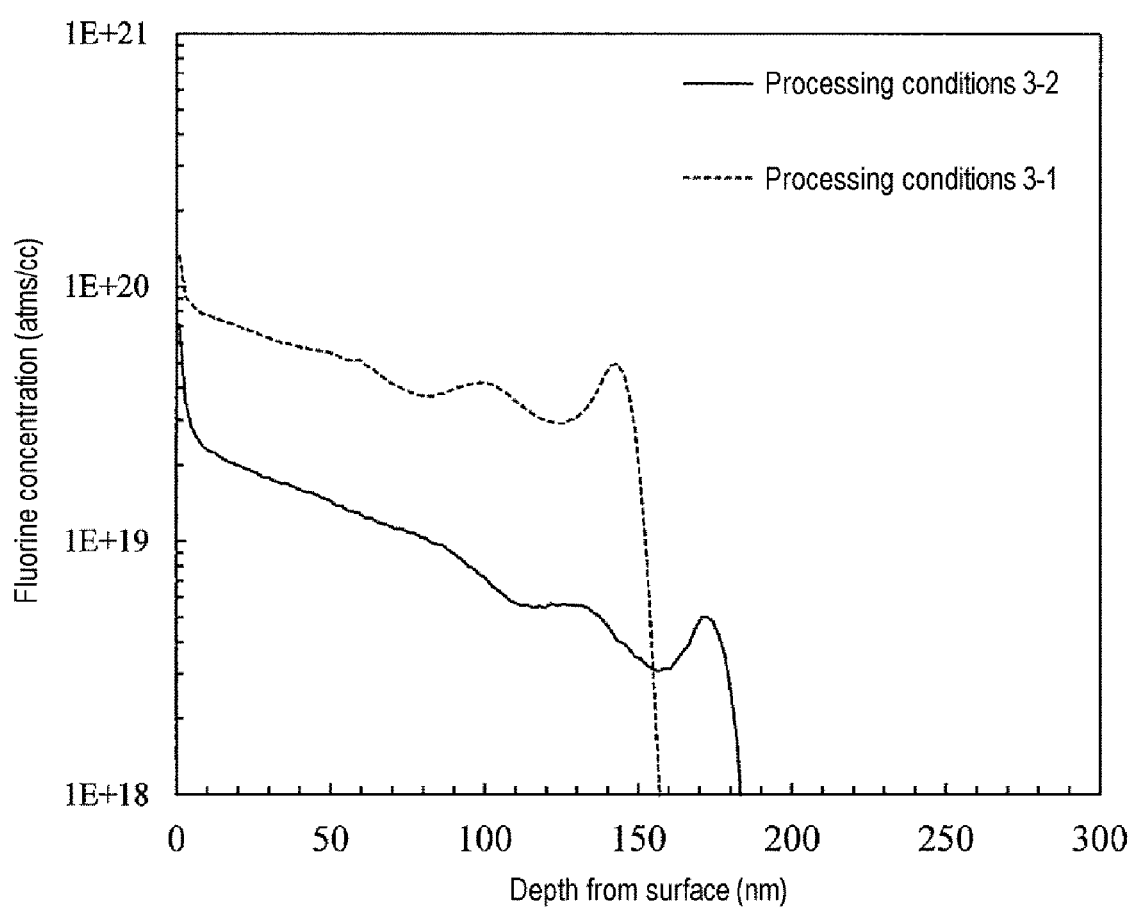

METHOD AND APPARATUS FOR PROCESSING OXYGEN-CONTAINING WORKPIECE

CROSS-REFERENCE TO RELATED APPLICATION

This application is based upon and claims the benefit of priority from Japanese Patent Application No. 2018-149721, filed on Aug. 8, 2018, the entire contents of which are incorporated herein by reference.

TECHNICAL FIELD

The present disclosure relates to a method and an apparatus for processing an oxygen-containing workpiece.

BACKGROUND

Non-Patent Document 1 discloses that a defect in a silicon dioxide ($SiO_2$) film can be improved by adding fluorine (F) to the $SiO_2$ film (Non-Patent Document 1: Mitani Yuichiro et al., "Reexamination of Fluorine Incorporation into $SiO_2$—Significant Improvement of Charge-to-Breakdown Distribution Tail", International Reliability Physics Symposium proceedings, IEEE, 1999, p93-98).

Patent Document 1 discloses that ultraviolet light transmission is improved when fluorine is added to quartz glass (Patent Document 1: JP Patent Publication 2009-203142).

SUMMARY

According to one embodiment of the present disclosure, there is provided a method of processing an oxygen-containing workpiece, the method comprising: controlling a fluorine concentration in the oxygen-containing workpiece based on at least one of a kind of a fluorine-containing processing gas, a processing temperature and a processing pressure used for processing the oxygen-containing workpiece.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a diagram illustrating a result of a test conducted by the inventors of the present disclosure.

FIG. 2 is a diagram illustrating another result of a test conducted by the inventors of the present disclosure.

FIG. 3A is a diagram illustrating another result of a test conducted by the inventors of the present disclosure. FIG. 3B is a diagram illustrating another result of a test conducted by the inventors of the present disclosure.

FIG. 4B is a diagram illustrating another result of a test conducted by the inventors of the present disclosure.

FIG. 5 is a diagram illustrating another result of a test conducted by the inventors of the present disclosure.

DETAILED DESCRIPTION

Figure 4A:
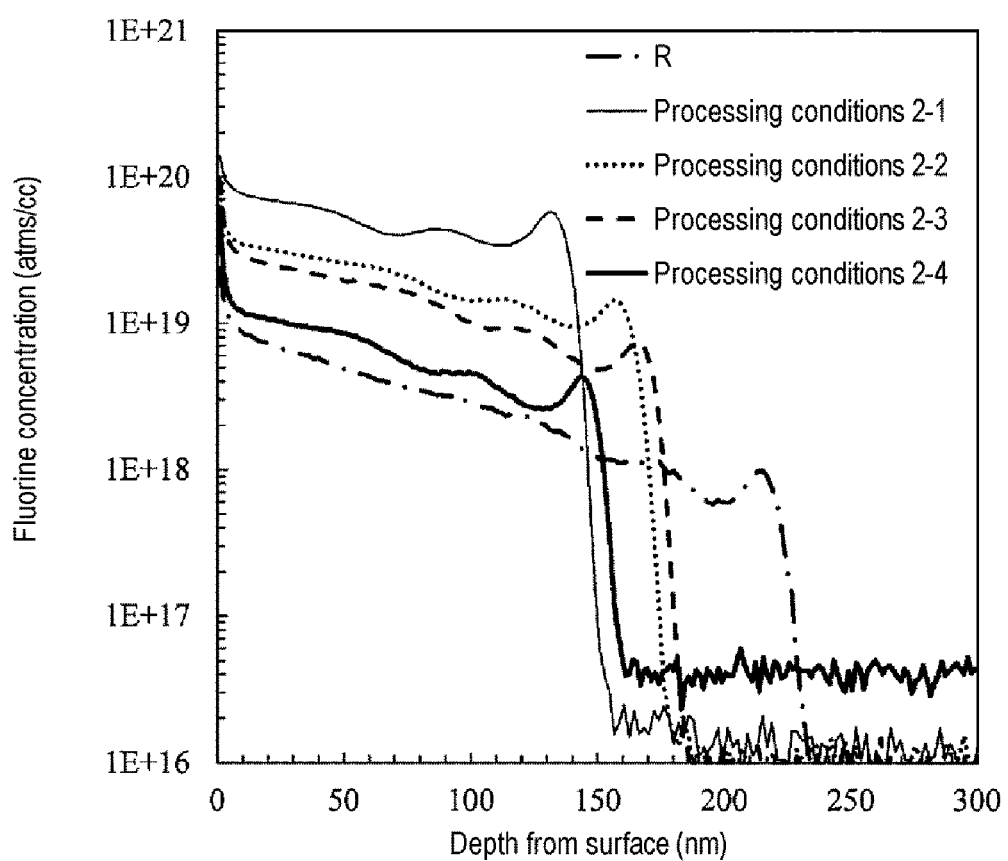
FIG. 4A is a diagram illustrating another result of a test conducted by the inventors of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An oxygen-containing body such as a $SiO_2$ film or quartz glass is used for various applications. For example, the $SiO_2$ film is used as an insulating film of a semiconductor device, and the quartz glass is used for a short wavelength light source.

As described above, Non-Patent Document 1 discloses that a defect in a $SiO_2$ film can be improved by adding fluorine to the $SiO_2$ film. Furthermore, as described above, Patent Document 1 discloses that ultraviolet light transmission is improved when fluorine is added to quartz glass. However, a method of controlling a fluorine concentration in the oxygen-containing body is not disclosed in Non-Patent Document 1 or Patent Document 1.

Therefore, a technique according to the present disclosure performs a nitrogen addition process on an oxygen-containing body, and controls a fluorine concentration in the oxygen-containing body. Hereinafter, the oxygen-containing body to be processed by the technique according to the present disclosure will be referred to as an oxygen-containing workpiece. In order to control the fluorine concentration in the oxygen-containing workpiece, the inventors of the present disclosure have performed the following three types of fluorine addition processes (a) to (c) on the oxygen-containing workpiece (processing results of which will be described later), and obtained the following findings (A) to (D) regarding the fluorine concentration in the oxygen-containing workpiece after the fluorine addition processes.

Fluorine addition process (a): A process of performing a chemical oxide removal (COR) process by supplying a fluorine-containing processing gas in a non-plasma state to an oxygen-containing workpiece.

Fluorine addition process (b): A process of supplying a fluorine-containing processing radical obtained by activating a fluorine-containing processing gas with remote plasma to an oxygen-containing workpiece for processing.

Fluorine addition process (c): A process of generating fluorine-containing processing ions from a fluorine-containing processing gas in an ion etching apparatus and supplying the fluorine-containing processing ions to an oxygen-containing workpiece for processing.

The COR process, which is a process performed for chemical etching, is a process of reacting an oxide film formed on a semiconductor wafer (hereinafter, sometimes referred to as a "wafer") with a processing gas.

(A) When supplying the fluorine-containing processing gas or the fluorine-containing processing radical as in the above (a) and (b), damage to a portion other than a portion of the oxygen-containing workpiece to be processed after the fluorine addition process is smaller than when supplying the fluorine-containing processing ions as in the above (c). Furthermore, the roughness of the surface of the oxygen-containing workpiece after the fluorine addition process is small. Moreover, the etching selectivity of the portion to be processed is high.

(B) During the fluorine addition process on the oxygen-containing workpiece, the fluorine concentration in the oxygen-containing workpiece after the fluorine addition process differs depending on a kind of the fluorine-containing processing gas supplied to the oxygen-containing workpiece.

(C) The fluorine concentration in the oxygen-containing workpiece after the fluorine addition process differs depending on a processing temperature during the fluorine addition process on the oxygen-containing workpiece.

(D) The fluorine concentration in the oxygen-containing workpiece after the fluorine addition process differs depending on a processing pressure during the fluorine addition process on the oxygen-containing workpiece.

Hereinafter, tests 1 to 3 in which the inventors of the present disclosure have obtained the findings (A) to (D) described above will be described. The oxygen-containing workpiece used in tests 1 to 3 is a $SiO_2$ film of 150 nm formed on a Si substrate using a Flowable Chemical Vapor Deposition (FCVD) method. Furthermore, results of fluorine concentration distributions in tests 1 to 3 illustrated below are results obtained by performing a Post Heat Treatment (PHT) process after the fluorine addition process. The PHT process is a heating process that heats a reaction product generated on a substrate surface or the like in the COR process or the like for vaporization.

(Test 1)

FIG. 1 is a diagram illustrating, as a result of test 1, a fluorine concentration distribution of a $SiO_2$ film in a depth direction after the fluorine addition process under processing conditions 1-1 to 1-3. FIG. 2 is a diagram illustrating a fluorine concentration distribution after the fluorine addition process under processing conditions 1-1, 1-4 to 1-6, and FIGS. 3A and 3B are diagrams illustrating fluorine concentration distributions after the fluorine addition process under processing conditions 1-1, 1-6 and 1-7. FIGS. 1, 2 and 3A illustrate fluorine concentration distributions after the fluorine addition process from a surface of a Si substrate, on which the $SiO_2$ film is formed, to a portion of 300 nm depth, and FIG. 3B illustrates a fluorine concentration distribution after the fluorine addition process from the surface of the Si substrate to a portion of 50 nm. Furthermore, in FIGS. 1, 2, 3A and 3B, a fluorine concentration distribution of an unprocessed $SiO_2$ film in the depth direction, in which no process is performed, is indicated as a reference value R.

In test 1, the fluorine addition process was performed on the $SiO_2$ film by differently supplying to the $SiO_2$ film to obtain a fluorine concentration distribution of the processed $SiO_2$ film in the depth direction based on a result measured by a Secondary Ion Mass Spectrometry (SIMS). Under the processing conditions 1-1 to 1-5 in test 1, the fluorine addition process was performed by supplying a fluorine-containing processing gas in a non-plasma state to the $SiO_2$ film on a Si substrate in a COR module that performs the COR process. The supplied fluorine-containing processing gas is a mixed gas of an HF gas and an $NH_3$ gas under the processing condition 1-1, a $ClF_3$ gas under the processing condition 1-2, an $F_2$ gas under the processing condition 1-3, an HF gas under the processing condition 1-4, and a mixed gas of an HF gas and an $H_2O$ gas under the processing condition 1-5. Furthermore, in the processing conditions 1-1 to 1-5, a temperature of the $SiO_2$ film as a processing temperature, i.e., a temperature of the Si substrate is 5 to 120 degrees C., and a processing pressure is 10 mTorr to 10 Torr. Under the processing conditions 1-6 and 1-7 in test 1, the fluorine addition process was performed by supplying a fluorine-containing processing radical obtained by activating the fluorine-containing processing gas by remote plasma to the $SiO_2$ film on the Si substrate in an RST module that performs etching using the remote plasma. The supplied fluorine-containing processing radical is an $NF$ radical under the processing condition 1-6 and an HF radical under the processing condition 1-7. The processing conditions 1-6 and 1-7 are the same excepting the kind of supplied gas used, and the temperature of the $SiO_2$ film as the processing temperature, i.e., the temperature of the Si substrate is 5 to 120 degrees C., and the processing pressure is 10 mTorr to 10 Torr.

Under processing condition 1-8 in test 1, the fluorine addition process was performed by generating fluorine-containing processing ions from the fluorine-containing processing gas in the ion etching apparatus and supplying the fluorine-containing processing ions to the $SiO_2$ film on the Si substrate in the ion etching apparatus.

As illustrated in FIGS. 1 to 3A and 3B, when supplying the fluorine-containing processing gas (processing conditions 1-1 to 1-5) and also when supplying the fluorine-containing processing radical (processing conditions 1-6 and 1-7), the fluorine concentration in the $SiO_2$ film after the fluorine addition process becomes higher than when no process is performed.

Although not shown, also when supplying the fluorine-containing processing ions (processing conditions 1-8), the fluorine concentration in the $SiO_2$ film after the fluorine addition process becomes higher than when no process is performed.

However, when supplying the fluorine-containing processing ions, damage to a portion other than a portion of the $SiO_2$ film to be processed after the fluorine addition process was greater than when supplying the fluorine-containing processing gas or the fluorine-containing processing radical. In addition, the roughness of the surface of the $SiO_2$ film after the process is large. Furthermore, the etching selectivity of the portion to be processed is low.

That is, as in the finding (A) described above, when supplying the fluorine-containing processing gas or the fluorine-containing processing radical, the damage to a portion other than the portion of the oxygen-containing workpiece to be processed after the fluorine addition process is smaller than when supplying the fluorine-containing processing ions. In addition, the roughness of the surface of the oxygen-containing workpiece after the process is small. Furthermore, the etching selectivity of the portion to be processed is high.

In addition, as illustrated in FIGS. 1 to 3A and 3B, when supplying the fluorine-containing processing gas or the fluorine-containing processing radical to the $SiO_2$ film, the fluorine concentration in the $SiO_2$ film after the fluorine addition process differs depending on a kind of the fluorine-containing processing gas. For example, the fluorine concentration of a predetermined portion in the $SiO_2$ film in the depth direction after the fluorine addition process differs depending on a kind of the fluorine-containing processing gas or the fluorine-containing processing radical during the fluorine addition process.

That is, as in the finding (B) described above, the fluorine concentration in the oxygen-containing workpiece after the fluorine addition process differs depending on the kind of the fluorine-containing gas used during the fluorine addition process on the $SiO_2$ film.

Furthermore, although not shown, the fluorine addition process was performed by setting the conditions the same as the processing conditions 1-1 to 1-5 except for the kind of supplied gas and supplying a mixed gas of an HF gas and an alcohol gas as the fluorine-containing processing gas in a non-plasma state. Also, in this case, the fluorine concentration in the $SiO_2$ film becomes higher than when no process is performed and differs from fluorine concentrations in the $SiO_2$ film when supplying another kind of fluorine-containing processing gas.

In addition, when supplying the mixed gas of the HF gas and the $NH_3$ gas as the fluorine-containing processing gas and when supplying the $NF_3$ radical or the HF radical as the fluorine-containing processing radical, the distributions of the fluorine concentration in the $SiO_2$ film in the depth direction after the fluorine addition process are different from each other. When supplying the mixed gas of the HF gas and the $NH_3$ gas, the fluorine concentration in the $SiO_2$ film after the fluorine addition process becomes substantially uniform in the depth direction. On the other hand, when supplying the $NF_3$ radical or the HF radical, the fluorine concentration is high only in the surface layer of the $SiO_2$ film, specifically, the fluorine concentration is high from the surface of the $SiO_2$ film to 20 to 30 nm. However, in a portion deeper than 30 nm, the reduction rate of the fluorine concentration to the depth is large compared with when supplying the mixed gas of the HF gas and the $NH_3$ gas.

(Test 2)

FIGS. 4A and 4B are diagrams illustrating, as a result of test 2, fluorine concentration distributions of the $SiO_2$ film in the depth direction after the fluorine addition process under processing conditions 2-1 to 2-4. FIG. 4A illustrates a fluorine concentration distribution after the fluorine addition process from a surface of a Si substrate, on which the $SiO_2$ film is formed, to a portion of 300 nm depth, and FIG. 4B illustrates a fluorine concentration distribution after the fluorine addition process from the surface to a portion of 50 nm. Furthermore, in FIGS. 4A and 4B, a fluorine concentration distribution of an unprocessed $SiO_2$ film in the depth direction is indicated as a reference value R.

In test 2, the fluorine concentration distribution of the $SiO_2$ film in the depth direction after the fluorine addition process was obtained based on a result measured by SIMS by setting the temperature of the Si substrate, on which the $SiO_2$ film is formed, different as the processing temperature when the fluorine addition process is performed by supplying the fluorine-containing gas.

The temperature of the Si substrate in test 2 is 110 degrees C. under the processing condition 2-1, 100 degrees C. under the processing condition 2-2, 90 degrees C. under the processing condition 2-3, and 20 degrees C. under the processing condition 2-4. Furthermore, in the processing conditions 2-1 to 2-4, the processing pressure is 10 mTorr to 10 Torr.

As illustrated in FIG. 4, when supplying the fluorine-containing gas to the $SiO_2$ film, the fluorine concentration in the $SiO_2$ film after the fluorine addition process becomes higher according to an increase of the substrate temperature.

That is, as in the finding (C) described above, the fluorine concentration in the oxygen-containing workpiece after the fluorine addition process differs depending on the processing temperature during the fluorine addition process on the oxygen-containing workpiece.

(Test 3)

FIG. 5 is a diagram illustrating, as a result of test 3, a fluorine concentration distribution of the $SiO_2$ film in the depth direction after the fluorine addition process under processing conditions 3-1 and 3-2.

In test 3, the fluorine concentration distribution of the $SiO_2$ film in the depth direction after the fluorine addition process was obtained based on a result measured by SIMS by setting the processing pressure when the fluorine addition process is performed by supplying the fluorine-containing gas to the $SiO_2$ film different. Furthermore, in test 3, the partial pressure of HF as the processing pressure was set different between the processing conditions 3-1 and 3-2.

The fluorine-containing gas in test 3 is a mixed gas of an HF gas and an $NH_3$ gas. The partial pressure of HF in test 3 is 2,099 mTorr under the processing condition 3-1 and 423 mTorr under the processing condition 3-2. Furthermore, in the processing conditions 3-1 and 3-2, the temperature of the Si substrate, on which the $SiO_2$ film is formed, as the processing temperature is 5 to 120 degrees C.

As illustrated in FIG. 5, when supplying the fluorine-containing gas to the $SiO_2$ film, the fluorine concentration in the $SiO_2$ film after the fluorine addition process becomes higher according to an increase of the processing pressure.

That is, as in the finding (D) described above, the fluorine concentration in the oxygen-containing workpiece after the fluorine addition process differs depending on the processing pressure of the oxygen-containing workpiece during the fluorine addition process.

In the processing method according to the present embodiment, the fluorine addition process is performed by supplying the fluorine-containing processing gas or the fluorine-containing processing radical activated by remote plasma to the oxygen-containing workpiece based on the findings (A) to (D) described above. Then, in the processing method according to the present embodiment, the fluorine concentration in the oxygen-containing processing workpiece after the fluorine addition process is controlled based on at least one of the kind of the fluorine-containing processing gas, the processing temperature, and the processing pressure used during the fluorine addition process.

Hereinafter, a configuration of a substrate processing apparatus as a processing apparatus according to the present embodiment will be described with reference to the drawings. In the present disclosure, elements having substantially like functional configuration are given like reference numerals and a repeated description thereof will be omitted.

<Substrate Processing Apparatus>

Figure 6:
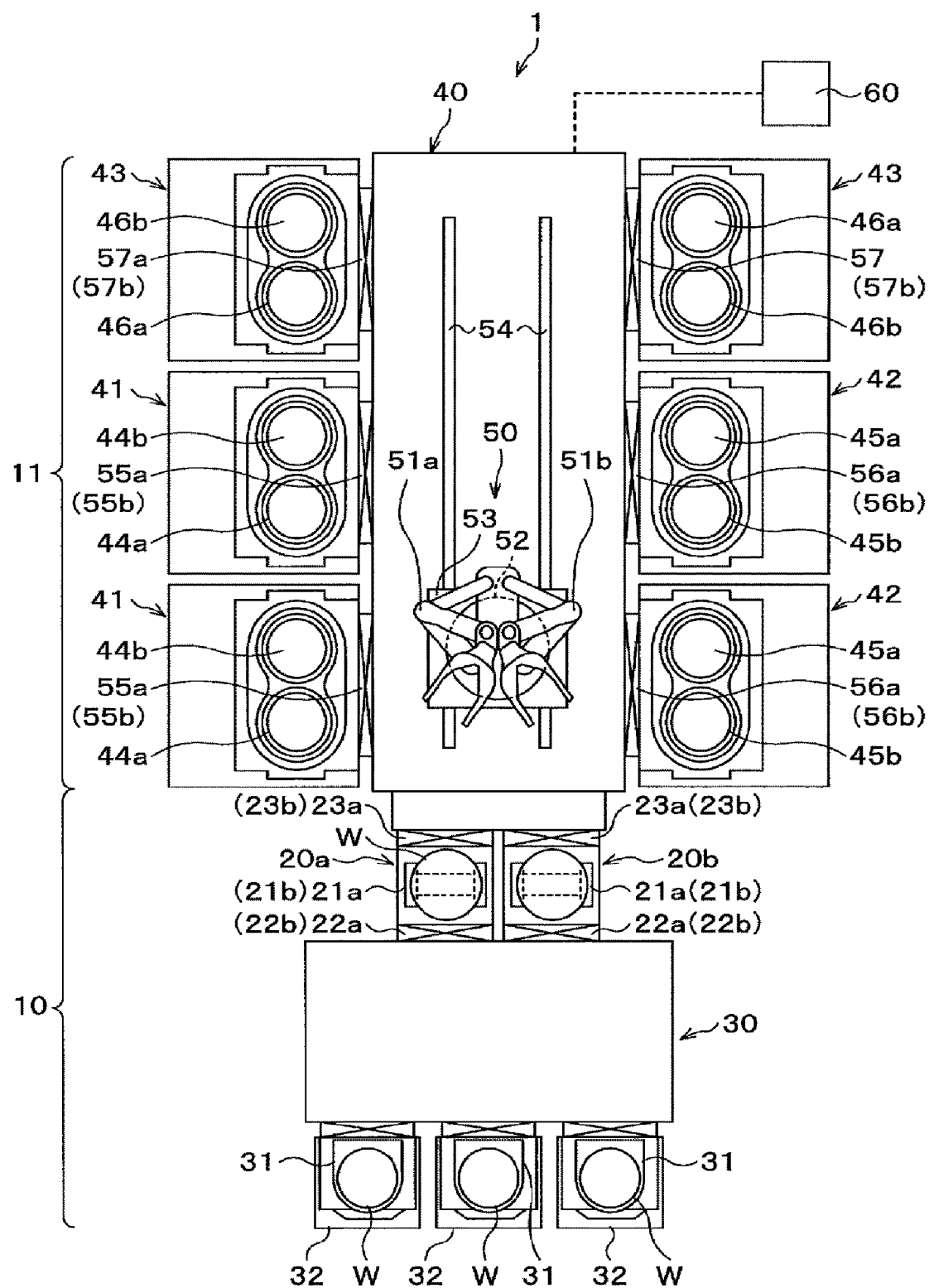
FIG. 6 is a plan view illustrating an outline of a configuration of a substrate processing apparatus according to an embodiment of the present disclosure.

FIG. 6 is a plan view illustrating an outline of a configuration of a substrate processing apparatus as a processing apparatus according to the present embodiment. In the present embodiment, a case in which a substrate processing apparatus 1 includes a COR processing module, a PHT processing module, and an RST processing module as various processing modules will be described. The COR processing module performs a COR process on wafers W as substrates, and the PHT processing module performs a PHT process on the wafers W. Furthermore, the RST processing module performs a process using a fluorine-containing radical activated by remote plasma. A module configuration of the substrate processing apparatus of the present disclosure is not limited thereto, but may be arbitrarily selected.

As illustrated in FIG. 6, the substrate processing apparatus 1 has a configuration in which an atmospheric part 10 and a depressurization part 11 are integrally connected via load lock modules 20a and 20b. The atmospheric part 10 includes a plurality of atmospheric modules that perform a predetermined process on the wafers W under an atmospheric pressure atmosphere. The depressurization part 11 includes a plurality of depressurization modules that perform a predetermined process on the wafers W under a depressurization atmosphere.

The load lock module 20a temporarily holds the wafers W in order to transfer the wafers W transferred from a loader module 30 of the atmospheric part 10 as described later to a transfer module 40 of the depressurization part 11 as described later. The load lock module 20a has an upper stocker 21a and a lower stocker 21b that hold two wafers W so as to overlap with each other.

Furthermore, the load lock module 20a is connected to the loader module 30 as described later via a gate 22b having a gate valve 22a. By this gate valve 22a, the airtightness between the load lock module 20a and the loader module 30 is secured and mutual communication therebetween is achieved. The load lock module 20a is also connected to the transfer module 40 as described later via a gate 23b having a gate valve 23a. By this gate valve 23a, the airtightness between the load lock module 20a and the transfer module 40 is secured and mutual communication therebetween is achieved.

In addition, the load lock module 20a is connected with a gas supply (not shown) for supplying a gas and a gas exhaust part (not shown) for exhausting a gas, and is configured so that the interior of the load lock module 20a is switchable between the atmospheric pressure atmosphere and the depressurization atmosphere by the gas supply and the gas exhaust part. That is, the load lock module 20a is configured to appropriately transfer the wafers W between the atmospheric part 10 in an atmospheric pressure atmosphere and the depressurization part 11 in a depressurization atmosphere. Furthermore, the load lock module 20b has the same configuration as the load lock module 20a, and thus, a description thereof will be omitted.

The atmospheric part 10 has the loader module 30 having a wafer transfer mechanism (not shown), and load ports 32 on which hoops 31 capable of storing a plurality of wafers W are mounted.

The loader module 30 is configured by a housing whose inside is rectangular and whose inside is maintained in an atmospheric pressure atmosphere. A plurality of load ports, for example, three load ports 32, are arranged in parallel on one side surface constituting the long side of the housing of the loader module 30. The load lock modules 20a and 20b are arranged in parallel on the other side of the long side of the housing of the loader module 30. The loader module 30 also has a wafer transfer mechanism (not shown) movable in a longitudinal direction inside the housing. The wafer transfer mechanism can transfer the wafers W between the hoops 31 mounted on the load ports 32 and the load lock modules 20a and 20b. A configuration of the wafer transfer mechanism is similar to a configuration of a wafer transfer mechanism 50 as described later.

The hoops 31 accommodate a plurality of wafers W so as to overlap with each other at equal intervals and in multiple stages. In addition, the insides of the hoops 31 mounted on the load ports 32 are filled with, for example, air, a nitrogen gas, or the like so as to be sealed.

The depressurization part 11 has the transfer module 40 that simultaneously transfers two wafers W, COR modules 41 that perform a COR process on the wafers W transferred from the transfer module 40, and PHT modules 42 that perform a PHT process. The insides of the transfer module 40, the COR modules 41, and the PHT modules 42 are each maintained in a depressurization atmosphere.

In the depressurization part 11, a series of processes, in the present embodiment, the COR process and the PHT process are sequentially performed on the wafers W. The COR modules 41, the PHT modules 42, and RST modules 43 are each installed in a plural number, in the present embodiment, for example, in two, in the transfer module 40.

The transfer module 40 is configured by a housing whose inside is rectangular. The transfer module 40 sequentially transfers, for example, the wafers W carried into the load lock module 20a to one COR module 41 and one PHT module 42 to perform the COR process and the PHT process. An oxide film as the oxygen-containing workpiece formed each of on the wafers W can be etched to a predetermined thickness by repeatedly performing the COR process and the PHT process a predetermined number of times. Then, the transfer module 40 transfers each of the wafers W whose oxide film is etched to the predetermined thickness to the COR module 41 or the RST module 43, and performs the fluorine addition process. Thereafter, the transfer module 40 unloads the wafers W to the atmospheric part 10 via the load lock module 20b.

Two stages 44a and 44b on which two wafers W are horizontally arranged and mounted are installed in the COR module 41. The COR module 41 simultaneously performs the COR process on the two wafers W by arranging and mounting the wafers W on the stages 44a and 44b. In addition, a gas supply (not shown) for supplying a processing gas, a purge gas or the like and a gas exhaust part (not shown) for exhausting a gas are connected to the COR module 41.

Two stages 45a and 45b on which two wafers W are horizontally arranged and mounted are installed in the PHT module 42. The PHT module 42 simultaneously performs the PHT process on the two wafers W by arranging and mounting the wafers W on the stages 45a and 45b. In addition, a gas supply (not shown) for supplying a gas and a gas exhaust part (not shown) for exhausting a gas are connected to the PHT module 42.

Two stages 46a and 46b on which two wafers W are horizontally arranged and mounted are installed in the RST module 43. The RST module 43 simultaneously performs the fluorine addition process on the two wafers W by arranging and mounting the wafers W on the stages 46a and 46b. In addition, a radical supply (not shown) for suppling a radical activated by remote plasma and a gas exhaust part (not shown) for exhausting an atmospheric gas in the RST module are connected to the RST module 43.

The wafer transfer mechanism 50 that transfers the wafers W is installed in the transfer module 40. The wafer transfer mechanism 50 has transfer arms 51a and 51b that hold and move two wafers W so as to overlap with each other, a rotary table 52 that rotatably supports the transfer arms 51a and 51b, and a rotary mounting table 53 on which the rotary table 52 is mounted. In addition, a guide rail 54 extending in the longitudinal direction of the transfer module 40 is installed in the transfer module 40. The rotary mounting table 53 is installed on the guide rail 54 and is configured to move the wafer transfer mechanism 50 along the guide rail 54.

The transfer module 40 is connected to the load lock modules 20a and 20b via the gate valves 23a and 23a as described above. In addition, the COR modules 41 are connected to the transfer module 40 via gates 55b having gate valves 55a. By these gate valves 55a, the airtightness between the transfer module 40 and the COR modules 41 is secured and mutual communication therebetween is archieved. Furthermore, the PHT modules 42 are connected to the transfer module 40 via gates 56b having gate valves 56a. By these gate valves 56a, the airtightness between the transfer module 40 and the PHT modules 42 is secured and mutual communication therebetween is achieved. In addition, the RST modules 43 are connected to the transfer module 40 via gates 57b having gate valves 57a. By these gate valves 57a, the airtightness between the transfer module 40 and the RST modules 43 is secured and mutual communication therebetween is achieved.

A controller 60 is installed in the substrate processing apparatus 1 described above. The controller 60 is, for example, a computer, and has a program storage (not shown). A program for controlling the processing of the wafers W in the substrate processing apparatus 1 is stored in the program storage. In addition, a control program for causing a processor to control various processes, or a program for causing each component of the substrate processing apparatus 1 to process the wafers W according to the processing conditions, for example, a process recipe, is stored in the program storage. The program described above is recorded in a computer-readable storage medium and may be installed in the controller 60 from the storage medium.

<Operation of the Substrate Processing Apparatus>

The substrate processing apparatus 1 is configured as described above, and next, a wafer processing in the substrate processing apparatus 1 will be described.

First, the hoops 31 accommodating a plurality of wafers W are mounted on the load ports 32. It is assumed that a $SiO_2$ film as an oxygen-containing film to be processed is formed on each wafer W using FCVD.

Thereafter, two wafers W are discharged from the hoops 31 by the loader module 30 and loaded into the load lock module 20a. When the two wafers W are loaded into the load lock module 20a, the gate valve 22a is closed, and the inside of the load lock module 20a is sealed and depressurized. Thereafter, the gate valve 23a is opened, and the inside of the load lock module 20a and the inside of the transfer module 40 are communicated with each other.

Next, when the load lock module 20a and the transfer module 40 communicate with each other, the two wafers W are held by the transfer arm 51a of the wafer transfer mechanism 50 so as to overlap with each other, and are loaded into the transfer module 40 from the load lock module 20a. Subsequently, the wafer transfer mechanism 50 is moved to the front of one COR module 41.

Next, the gate valve 55a is opened, and the transfer arm 51a holding the two wafers W enters the COR module 41. Then, the wafers W are mounted one by one on the respective stages 44a and 44b from the transfer arm 51a. Thereafter, the transfer arm 51a is withdrawn from the COR module 41.

Next, when the transfer arm 51a is withdrawn from the COR module 41, the gate valve 55a is closed and the COR process is performed on the two wafers W in the COR module 41.

Next, when the COR process in the COR module 41 is completed, the gate valve 55a is opened and the transfer arm 51a enters the COR module 41. Then, the two wafers W are transferred from the stages 44a and 44b to the transfer arm 51a, and are held by the transfer arm 51a so as to overlap with each other. Thereafter, the transfer arm 51a is withdrawn from the COR module 41, and the gate valve 55a is closed.

Next, the wafer transfer mechanism 50 is moved to the front of the PHT module 42. Subsequently, the gate valve 56a is opened, and the transfer arm 51a holding the two wafers W enters the PHT module 42. Then, the wafers W are transferred one by one from the transfer arm 51a to each of the stages 45a and 45b. Thereafter, the transfer arm 51a is withdrawn from the PHT module 42. Subsequently, the gate valve 56a is closed, and the PHT process is performed on the two wafers W.

Next, when the PHT process of the wafers W is completed, the gate valve 56a is opened and the transfer arm 51b enters the PHT module 42. Then, the two wafers W are transferred from the stages 45a and 45b to the transfer arm 51b, and the two wafers W are held by the transfer arm 51b. Thereafter, the transfer arm 51b is withdrawn from the PHT module 42, and the gate valve 56a is closed.

Thereafter, the gate valve 55a is opened, and the two wafers W are transferred back to the COR module 41 by the wafer transfer mechanism 50. Thereafter, the transfer of the wafers W by the transfer arms 51a and 51b, or the like is repeatedly performed until the number of times of each of the COR process and the PHT process described above reaches a predetermined number of times.

After each of the COR process and the PHT process has been repeatedly performed the predetermined number of times, the kind of the fluorine-containing processing gas used in a subsequent fluorine addition process is selected, for example, according to a desired fluorine concentration of the $SiO_2$ film on each of the wafers W. This selection may be automatically performed by the controller 60 according to the desired fluorine concentration, or may be performed according to an input from the operator. Furthermore, the supply form of the fluorine-containing processing gas, i.e., whether the gas is supplied in a non-plasma state or the fluorine-containing processing gas is activated by remote plasma and supplied as the fluorine-containing processing radical, is also selected as necessary. The fluorine-containing processing gas is, for example, a mixed gas of an HF gas and an $NH_3$ gas, a $ClF_3$ gas, an $F_2$ gas, an HF gas, a mixed gas of an HF gas and an $H_2O$ gas, or a mixed gas of an HF gas and an alcohol gas.

Then, the COR module 41 or the RST module 43 that supplies the selected fluorine-containing processing gas to the wafers W in the selected supply form is selected. This selection may be automatically performed by the controller 60 from a correspondence table of the processing module and a kind of processing gas that can be supplied to the wafers W by the processing module, which is stored in the storage (not shown), or may be performed according to an input from the operator.

The selection of the kind of the fluorine-containing processing gas, the selection of the supply form of the fluorine-containing processing gas, and the selection of the COR module 41 or the RST module 43 that supplies the fluorine-containing processing gas to the wafers W as described above may also be performed in advance.

It is assumed here that the RST module 43 is selected.

The wafers W on which the COR process and the PHT process have been repeatedly performed the predetermined number of times are held by the wafer transfer mechanism 50, and the wafer transfer mechanism 50 is moved to the front of the RST module 43. Subsequently, the gate valve 57a is opened, and the transfer arm 51a holding the two wafers W enters the RST module 43. Then, the wafers W are transferred one by one from the transfer arm 51a to each of the stages 46a and 46b. Thereafter, the transfer arm 51a is withdrawn from the RST module 43. Subsequently, the gate valve 57a is closed. Then, the selected fluorine-containing processing gas is supplied in the selected supply form to the $SiO_2$ film of each of the two wafers W, i.e., the gas is activated by remote plasma and supplied as the fluorine-containing processing radical, and the fluorine addition process is performed.

Next, when the fluorine addition process on the $SiO_2$ film of the wafers W is completed, the gate valve 57a is opened and the transfer arm 51a enters the RST module 43. Then, the two wafers W are transferred from the stages 46a and 46b to the transfer arm 51a, and the two wafers W are held by the transfer arm 51a. Thereafter, the transfer arm 51a is withdrawn from the RST module 43, and the gate valve 57a is closed.

Next, the wafer transfer mechanism 50 is moved to the front of the PHT module 42. Subsequently, the gate valve 56a is opened, and the transfer arm 51a holding the two wafers W enters the PHT module 42. Then, the wafers W are transferred one by one from the transfer arm 51a to each of the stages 45a and 45b. Thereafter, the transfer arm 51a is withdrawn from the PHT module 42. Subsequently, the gate valve 56a is closed, and the PHT process is performed on the two wafers W.

When the PHT process of the wafers W is completed, the gate valve 56a is opened and the transfer arm 51b enters the PHT module 42. Then, the two wafers W are transferred from the stages 45a and 45b to the transfer arm 51b, and the two wafers W are held by the transfer arm 51b. Thereafter, the transfer arm 51b is withdrawn from the PHT module 42, and the gate valve 56a is closed.

Thereafter, the gate valve 23a is opened, and the two wafers W are loaded into the load lock module 20b by the wafer transfer mechanism 50. When the wafers W are loaded into the load lock module 20b, the gate valve 23a is closed, the inside of the load lock module 20b is sealed, and the atmosphere is released. Thereafter, the wafers W are returned into the hoops 31 mounted on the load ports 32 by the loader module 30 and the wafer processing in the substrate processing apparatus 1 is completed.

The example of the wafer processing described above is an example of selecting the kind of the fluorine-containing processing gas used in the fluorine addition process according to the fluorine concentration required for the $SiO_2$ film on each of the wafers W. In other words, this is an example in which the fluorine concentration of the $SiO_2$ film after the fluorine addition process is controlled based on the kind of fluorine-containing processing gas used in the fluorine addition process.

When controlling the fluorine concentration of the $SiO_2$ film after the fluorine addition process based on the processing temperature during the fluorine addition process, the processing temperature during the fluorine addition process is selected before the fluorine addition process according to the fluorine concentration required for the $SiO_2$ film on each of the wafers W. Then, for example, after the etching of the $SiO_2$ film, the wafers W are transferred to a predetermined processing module (for example, the COR module 41) and the fluorine addition process is performed at the selected processing temperature. The wafers W after the fluorine addition process are returned into the hoops 31 in the same manner as described above.

Similarly, when controlling the fluorine concentration of the $SiO_2$ film after the fluorine addition process based on the processing pressure during the fluorine addition process, the processing pressure during the fluorine addition process is selected before the fluorine addition process according to the fluorine concentration required for the $SiO_2$ film on each of the wafers W. Then, for example, after the etching of the $SiO_2$ film, the wafers W are transferred to a predetermined processing module (for example, the COR module 41) and the fluorine addition process is performed at the selected processing pressure.

Furthermore, in the aforementioned example, the fluorine concentration of the $SiO_2$ film after the fluorine addition process is controlled based on any one of the kind of the fluorine-containing processing gas, the processing temperature, and the processing pressure. Instead of this, the fluorine concentration of the $SiO_2$ film after the fluorine addition process may be controlled based on a combination of the kind of the fluorine-containing processing gas, the processing temperature, and the processing pressure. That is, the fluorine concentration of the $SiO_2$ film after the fluorine addition process may be controlled based on at least one of the kind of the fluorine-containing processing gas, the processing temperature, and the processing pressure.

In addition, the fluorine concentration of the oxygen-containing workpiece after the fluorine addition process may be controlled based on a processing time of the fluorine addition process. It was confirmed by the inventors of the present disclosure that this is because the fluorine concentration in the $SiO_2$ film after the fluorine addition process differs depending on the processing time of the fluorine addition process.

Furthermore, in the aforementioned test 1, the following finding was also acquired. When a mixed gas of an HF gas and an $NH_3$ gas as the fluorine-containing processing gas is supplied in a non-plasma state and when an $NF_3$ radical or an HF radical is supplied as the fluorine-containing processing radical, the finding is that the fluorine concentration distribution in the $SiO_2$ film along the depth direction differs.

Based on this finding, the controller 60 may control the fluorine concentration distribution in the $SiO_2$ film by selecting whether to supply the mixed gas as the fluorine-containing gas in a non-plasma state or to supply the fluorine-containing radical such as an $NF_3$ radical activated by remote plasma. In other words, the controller 60 may control the fluorine concentration distribution in the $SiO_2$ film based on which of the COR module 41 and the RST module 43 is used to perform the fluorine addition process.

In the aforementioned example, the COR process based on the etching process of the $SiO_2$ film and the fluorine addition process are different from each other. However, when the processing gas used for the COR process and the fluorine-containing processing gas used for the fluorine addition process are the same, the COR process in the COR module 41 may also serve as the fluorine addition process.

In addition, a purge process using a purge gas such as an HF gas may be performed between the COR process and a next COR process in the same COR module 41. Therefore, when the purge gas of the COR module 41 and the gas used for the fluorine addition process are the same, the wafers W are transferred to the COR module 41 during the purge process of the COR module 41 and the fluorine addition process may be performed simultaneously with the purge process by the COR module 41. That is, the purge process of purging the COR module 41 may be the fluorine addition process of performing the fluorine addition process on the $SiO_2$ film.

Furthermore, in the aforementioned example, it was assumed that the oxygen-containing workpiece is the $SiO_2$ film formed on the Si substrate using the FCVD method. However, the oxygen-containing workpiece according to the present embodiment is not limited to the aforementioned one, but may be a thermal oxide film, a SiOC film, a SiOCN film, or an oxygen-containing film such as SiON or the like, or may be a high-k metal-containing oxide film. The high-k metal-containing oxide film is, for example, an oxide film of HfOx or a metal or alloy such as W, Al, AlTi, TiN, TaN, TaSiN, Co, Ru or the like. Also, the oxygen-containing workpiece according to the present embodiment may be a part made of an oxygen-containing material such as quartz glass, for example, a quartz glass substrate or a quartz glass part.

As described above, according to the present embodiment, the fluorine addition process on the oxygen-containing workpiece uses the fluorine-containing processing gas in a non-plasma state or the fluorine-containing processing radical activated by remote plasma instead of the fluorine-containing ions. Therefore, fluorine can be added to the oxygen-containing workpiece after the fluorine addition process. In addition, the damage to the portion other than the portion of the oxygen-containing workpiece to be processed after the fluorine addition process is small. Furthermore, the roughness of the surface of the oxygen-containing workpiece after the process is small. Moreover, the etching selectivity of the portion to be processed is high.

In addition, according to the present embodiment, it is possible to control the fluorine concentration in the oxygen-containing workpiece after the fluorine addition process.

By performing the control in this manner, when the oxygen-containing workpiece is the $SiO_2$ film, it is possible to suppress a defect in the $SiO_2$ film and to improve the insulating property. Furthermore, the insulating property used herein is, for example, a total amount of electrons allowed to pass through before dielectric breakdown. The following effects can be obtained when the oxygen-containing workpiece is an oxygen-containing film formed on the Si substrate or the like and has a dangling bond of Si at an interface with the substrate before the fluorine addition process. That is, by controlling the fluorine concentration in the oxygen-containing film after the fluorine addition process, fluorine can be added to the interface between the oxygen-containing film and the substrate to change the dangling bond of Si to Si—F. Thus, it is possible to stabilize the oxygen-containing film.

Furthermore, by controlling the fluorine concentration in the oxygen-containing workpiece after the fluorine addition process as in the present embodiment, when the oxygen-containing workpiece is a quartz glass substrate or a quartz glass part, it is possible to improve the function such as ultraviolet light transmission or the like.

Moreover, according to the present embodiment, since the fluorine concentration can be controlled, it is possible to improve water repellency.

In addition, in the present embodiment, since the purge process of purging the COR module 41 is also the fluorine addition process of performing the fluorine addition process on the oxygen-containing workpiece, it is possible to prevent a tact time from being longer by introducing the fluorine addition process.

Furthermore, the portion to be processed in one fluorine addition process is not limited to one, but may be multiple portions, and in the case of multiple portions, the kinds of oxygen-containing workpiece of each portion may be the same or different from each other.

The example of the oxygen-containing workpiece will be more specifically described with reference to FIGS. 7 to 11.

Figure 7A:
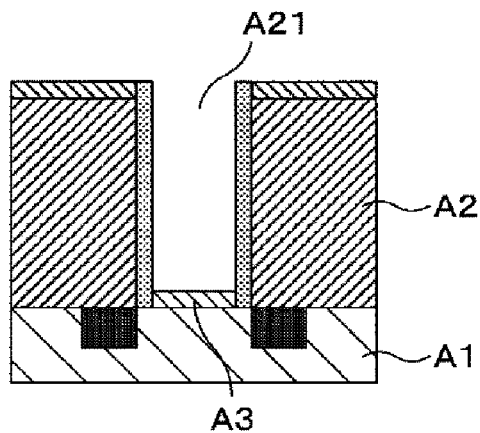
FIG. 7A is an explanatory view schematically illustrating an example of an oxygen-containing workpiece by a processing method according to an embodiment of the present disclosure.
Figure 7B:
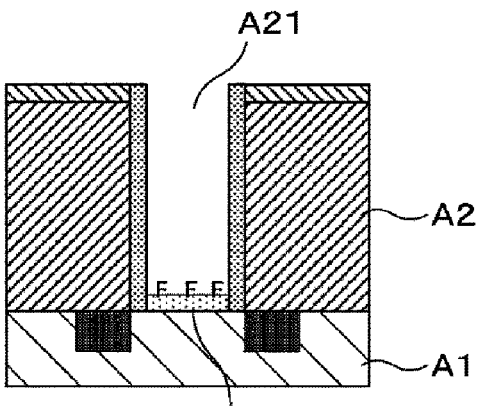
FIG. 7B is an explanatory view schematically illustrating an example of an oxygen-containing workpiece by a processing method according to an embodiment of the present disclosure.
Figure 7C:
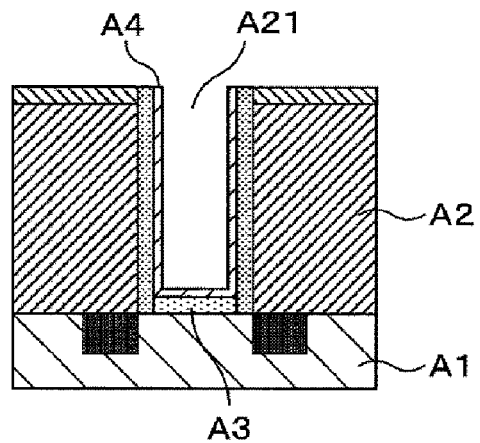
FIG. 7C is an explanatory view schematically illustrating an example of an oxygen-containing workpiece by a processing method according to an embodiment of the present disclosure.

As illustrated in FIG. 7A, an interlayer insulating film A2 may be formed on a Si substrate A1, and a gate oxide film A3 may be formed at a position on the Si substrate A1 at a bottom of a recess A21 formed in the interlayer insulating film A2. This gate oxide film A3 may be referred to as the oxygen-containing workpiece according to the present embodiment and subject to the fluorine addition process as illustrated in FIG. 7B. After the fluorine addition process, as illustrated in FIG. 7C, a metal oxide film A4 is formed along the inner peripheral surface of the recess A21.

Figure 8A:
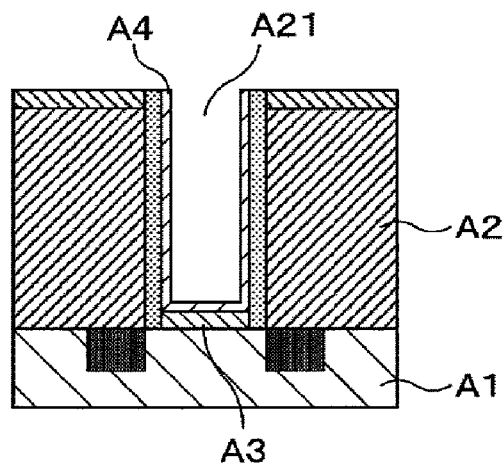
FIG. 8A is an explanatory view schematically illustrating an example of an oxygen-containing workpiece by the processing method according to the present embodiment.
Figure 8B:
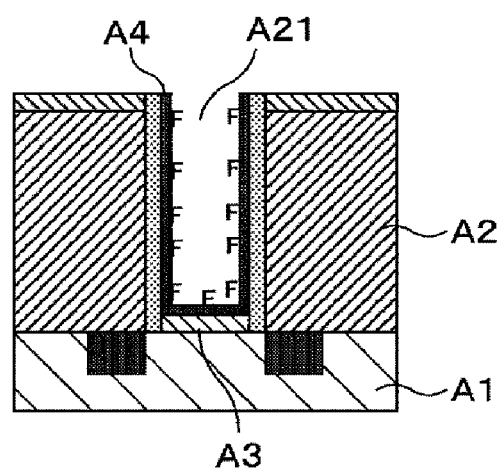
FIG. 8B is an explanatory view schematically illustrating an example of an oxygen-containing workpiece by the processing method according to the present embodiment.
Figure 8C:
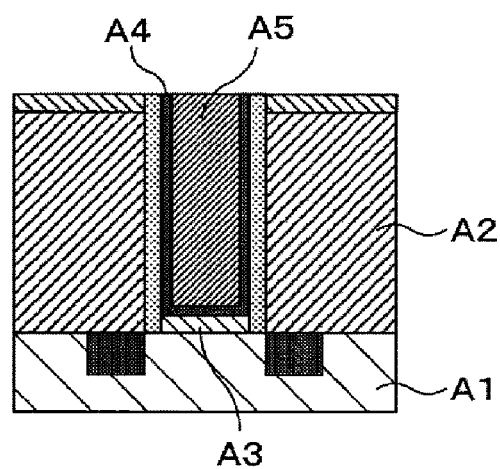
FIG. 8C is an explanatory view schematically illustrating an example of an oxygen-containing workpiece by the processing method according to the present embodiment.

Furthermore, as illustrated in FIG. 8A, the metal oxide film A4 is formed along the inner peripheral surface of the recess A21 without performing the fluorine addition process on the gate oxide film A3 at the bottom of the recess A21, and this metal oxide film A4 may be the oxygen-containing workpiece. In this case, as illustrated in FIG. 8B, after the fluorine addition process is performed on the metal oxide film A4, as illustrated in FIG. 8C, a gate metal A5 is formed in the recess A21.

Figure 9A:
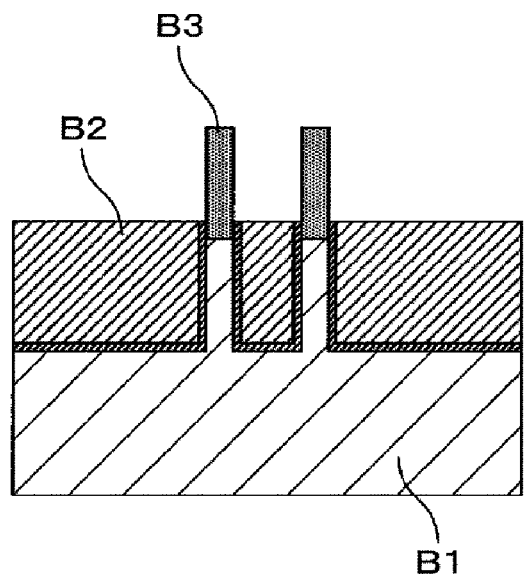
FIG. 9A is an explanatory view schematically illustrating an example of an oxygen-containing workpiece by the processing method according to the present embodiment.
Figure 9B:
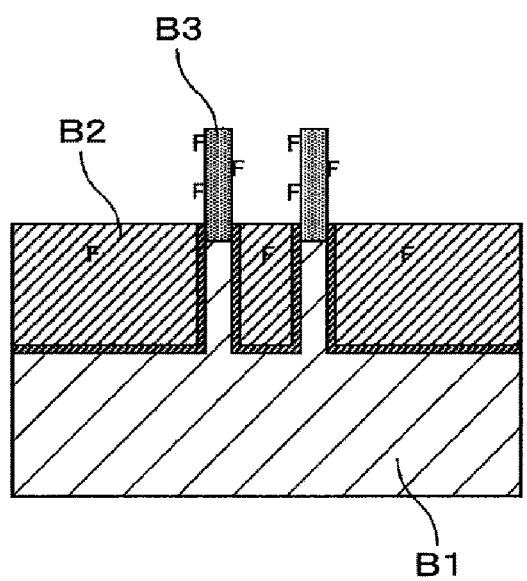
FIG. 9B is an explanatory view schematically illustrating an example of an oxygen-containing workpiece by the processing method according to the present embodiment.

As illustrated in FIG. 9A, an interlayer insulating film B2 may be formed on a Si substrate B1, and a pin B3 made of a Si or SiGe material may protrude from the interlayer insulating film B2. Then, the interlayer insulating film B2 may be formed of a material containing oxygen, and an oxide film may be formed on a surface of the pin B3. In this case, as illustrated in FIG. 9B, both of the interlayer insulating film B2 and the oxide film on the surface of the pin B3 may be the oxygen-containing workpiece and subjected to the fluorine addition process.

Figure 9C:
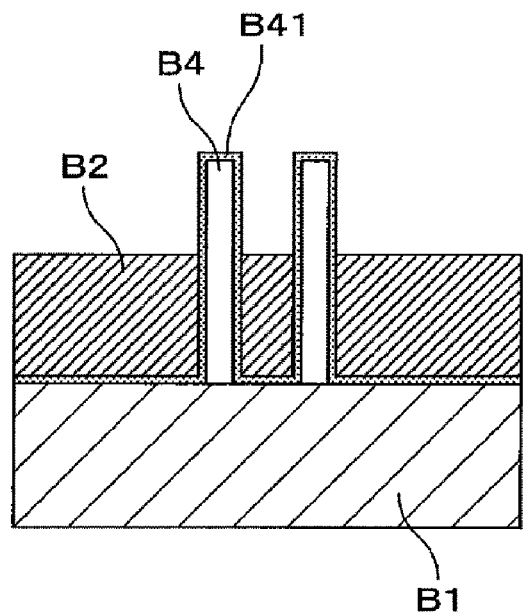
FIG. 9C is an explanatory view schematically illustrating an example of an oxygen-containing workpiece by the processing method according to the present embodiment.
Figure 9D:
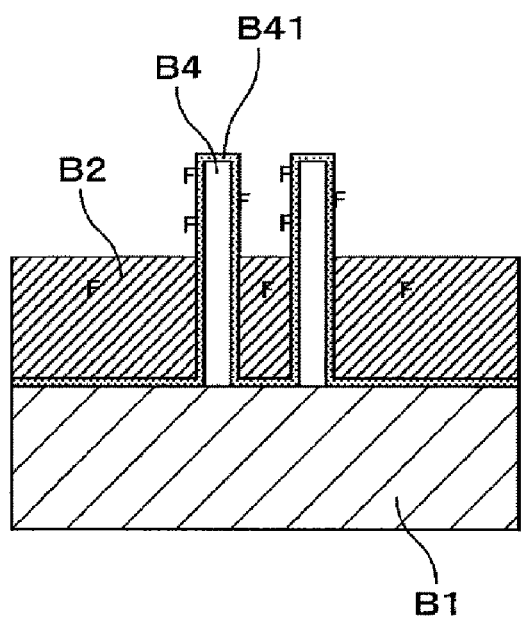
FIG. 9D is an explanatory view schematically illustrating an example of an oxygen-containing workpiece by the processing method according to the present embodiment.

Furthermore, as illustrated in FIG. 9C, the interlayer insulating film B2 may be formed on the Si substrate B1, and a pin B4 formed of a high-k material or a low-k material may protrude from the interlayer insulating film B2. Then, the interlayer insulating film B2 may be formed of a material containing oxygen, and the surface layer of the pin B4 may be formed of an oxide film layer B41. In this case, as illustrated in FIG. 9D, both of the interlayer insulating film B2 and the oxide film layer B41 on the surface layer of the pin B4 may be an oxygen-containing workpiece and subjected to the fluorine addition process.

Figure 10A:
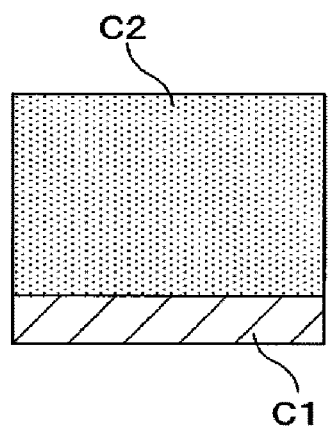
FIG. 10A is an explanatory view schematically illustrating an example of an oxygen-containing workpiece by the processing method according to the present embodiment.
Figure 10B:
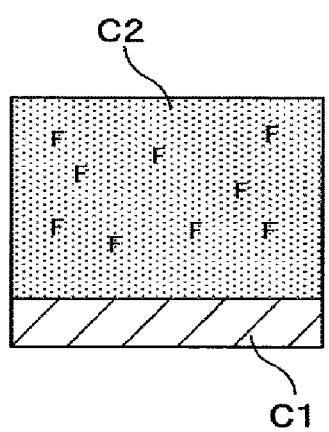
FIG. 10B is an explanatory view schematically illustrating an example of an oxygen-containing workpiece by the processing method according to the present embodiment.
Figure 10C:
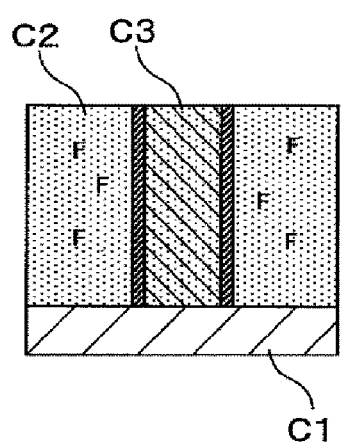
FIG. 10C is an explanatory view schematically illustrating an example of an oxygen-containing workpiece by the processing method according to the present embodiment.

As illustrated in FIG. 10A, a flat interlayer insulating film C2 may be formed on a Si substrate C1. In this case, as illustrated in FIG. 10B, the interlayer insulating film C2 may be an oxygen-containing workpiece and subjected to the fluorine addition process, and fluorine may be added to the entire interlayer insulating film C2. In this case, after the fluorine addition process, the interlayer insulating film C2 is etched so that a recess is formed in the interlayer insulating film C2, and the recess is filled with a metal C3 such as Cu or Co.

Figure 11A:
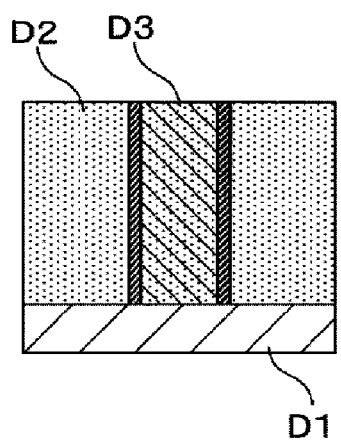
FIG. 11A is an explanatory view schematically illustrating an example of an oxygen-containing workpiece by the processing method according to the present embodiment.
Figure 11B:
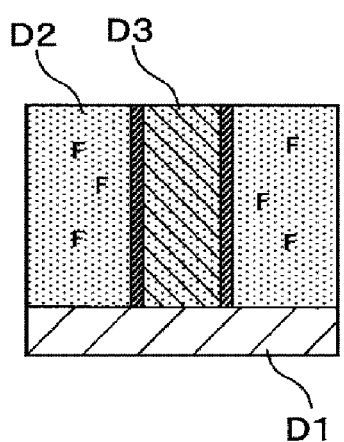
FIG. 11B is an explanatory view schematically illustrating an example of an oxygen-containing workpiece by the processing method according to the present embodiment.

As illustrated in FIG. 11A, a recess may be formed in an interlayer insulating film D2 formed on a Si substrate D1, and the recess may be filled with a metal D3 such as Cu or Co. In this case, as illustrated in FIG. 11B, the interlayer insulating film D2 in a state of being filled with the metal D3 such as Cu may be an oxygen-containing workpiece and subjected to the fluorine addition process.

It should be understood that the embodiment disclosed herein is illustrative and not restrictive in every respect. The aforementioned embodiment may be omitted, substituted, or changed in various forms without departing from the scope of the accompanying claims and the spirit thereof.

The following configurations are also within the technical scope of the present disclosure.

(1) A method of processing an oxygen-containing workpiece, the method includes controlling a fluorine concentration in the oxygen-containing workpiece based on at least one of a kind of a fluorine-containing processing gas, a processing temperature and a processing pressure used for processing the oxygen-containing workpiece.

According to the above (1), the fluorine concentration in the oxygen-containing workpiece can be controlled. As a result, it is possible to obtain an oxygen-containing workpiece of desired quality and performance.

(2) The method of (1), wherein the fluorine-containing processing gas is supplied to the oxygen-containing workpiece in a non-plasma state.

(3) The method of (2), wherein the fluorine-containing processing gas is a mixed gas of an HF gas and an $NH_3$ gas, a $ClF_3$ gas, an $F_2$ gas, an HF gas, a mixed gas of an HF gas and an $H_2O$ gas, or a mixed gas of an HF gas and an alcohol gas.

(4) The method of (1), wherein the fluorine-containing processing gas is activated by remote plasma and supplied to the oxygen-containing workpiece as a fluorine-containing radical.

(5) The method of any one of (1) to (4), wherein the fluorine concentration in the oxygen-containing workpiece is controlled further based on a processing time in processing the oxygen-containing workpiece.

(6) The method of any one of (1) to (5), wherein the step of controlling the fluorine concentration in the oxygen-containing workpiece includes processing the oxygen-containing workpiece by supplying the fluorine-containing processing gas to the oxygen-containing workpiece; and purging, with the fluorine-containing processing gas, a processing module used before the processing the oxygen-containing workpiece, and wherein the processing the oxygen-containing workpiece and the purging the processing module are performed simultaneously.

According to the above (6), it is possible to prevent a tact time from being longer by introducing the step of processing the oxygen-containing workpiece.

(7) An apparatus for processing an oxygen-containing workpiece, the apparatus includes: a processing module configured to process the oxygen-containing workpiece by supplying a fluorine-containing processing gas or a fluorine-containing radical activated by remote plasma to the oxygen-containing workpiece; and a controller configured to control a fluorine concentration in the oxygen-containing workpiece in the processing module based on at least one of a kind of the fluorine-containing processing gas, a processing temperature and a processing pressure used for processing in the processing module.

The above (7) has the same technical features as the above (1), i.e., it can obtain the oxygen-containing workpiece of desired quality and performance.

According to the present disclosure in some embodiments, it is possible to control a concentration distribution of fluorine in an oxygen-containing workpiece such as a $SiO_2$ film or quartz glass.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing an oxygen-containing workpiece, the method comprising:
controlling a fluorine concentration in the oxygen-containing workpiece based on at least one of a kind of a fluorine-containing processing gas, a processing temperature and a processing pressure used for processing the oxygen-containing workpiece,
wherein the controlling a fluorine concentration includes selecting whether the fluorine-containing processing gas in a non-plasma state is supplied to the oxygen-containing workpiece or the fluorine-containing processing gas is activated by a remote plasma and supplied to the oxygen-containing workpiece as a fluorine-containing processing radical, and
wherein the controlling a fluorine concentration in the oxygen-containing workpiece is performed such that the fluorine concentration in the oxygen-containing workpiece becomes higher by increasing the processing temperature used for processing the oxygen-containing workpiece.

2. The method of claim 1, wherein the fluorine-containing processing gas is selected from a mixed gas of an HF gas and an $NH_3$ gas, a $ClF_3$ gas, an $F_2$ gas, an HF gas, a mixed gas of an HF gas and an $H_2O$ gas, and a mixed gas of an HF gas and an alcohol gas.

3. The method of claim 2, wherein the fluorine concentration in the oxygen-containing workpiece is controlled further based on a processing time in processing the oxygen-containing workpiece.

4. The method of claim 3, wherein the step of controlling the fluorine concentration in the oxygen-containing workpiece further includes:

processing the oxygen-containing workpiece by supplying the fluorine-containing processing gas to the oxygen-containing workpiece; and purging, with the fluorine-containing processing gas, a processing module used before the processing the oxygen-containing workpiece, and wherein the processing the oxygen-containing workpiece and the purging the processing module are performed simultaneously.

5. The method of claim 1, wherein the fluorine concentration in the oxygen-containing workpiece is controlled further based on a processing time in processing the oxygen-containing workpiece.

6. The method of claim 1, wherein the step of controlling the fluorine concentration in the oxygen-containing workpiece further includes:

processing the oxygen-containing workpiece by supplying the fluorine-containing processing gas to the oxygen-containing workpiece; and purging, with the fluorine-containing processing gas, a processing module used before the processing the oxygen-containing workpiece, and wherein the processing the oxygen-containing workpiece and the purging the processing module are performed simultaneously.

\* \* \* \* \*